United States Patent
Mallikarjunaswamy et al.

(10) Patent No.: US 7,145,211 B2
(45) Date of Patent: Dec. 5, 2006

(54) SEAL RING FOR MIXED CIRCUITRY SEMICONDUCTOR DEVICES

(75) Inventors: Shekar Mallikarjunaswamy, San Jose, CA (US); Martin Alter, Los Altos, CA (US)

(73) Assignee: Micrel, Incorporated, San Jose, CA (US)

( * ) Notice: Subject to any disclaimer, the term of this patent is extended or adjusted under 35 U.S.C. 154(b) by 65 days.

(21) Appl. No.: 10/889,671

(22) Filed: Jul. 13, 2004

(65) Prior Publication Data

US 2006/0012003 A1 Jan. 19, 2006

(51) Int. Cl.
*H01L 29/76* (2006.01)

(52) U.S. Cl. ............... 257/409; 257/457; 257/484; 257/501; 257/E29.013

(58) Field of Classification Search ........ 257/409, 257/452, 457, 459, 484, 501, 506, 508, E29.013
See application file for complete search history.

(56) References Cited

U.S. PATENT DOCUMENTS

| | | | |
|---|---|---|---|
| 3,992,232 A | 11/1976 | Kaji et al. | |
| 6,395,591 B1 | 5/2002 | McCormack et al. | |
| 6,597,060 B1 | 7/2003 | Okada et al. | |
| 6,683,329 B1 | 1/2004 | Moriya | |
| 6,747,294 B1 * | 6/2004 | Gupta et al. | 257/127 |
| 6,879,023 B1 * | 4/2005 | Gutierrez | 257/547 |

* cited by examiner

*Primary Examiner*—Kenneth Parker
*Assistant Examiner*—Matthew E. Warren
(74) *Attorney, Agent, or Firm*—Ladas & Parry LLP

(57) ABSTRACT

In mixed-component, mixed-signal, semiconductor devices, selective seal ring isolation from the substrate and its electrical potential is provided in order to segregate noise sensitive circuitry from electrical noise generated by electrically noisy circuitry. Appropriate predetermined sections of such a mixed use chip are isolated from the substrate through a non-ohmic contact with the substrate without compromising reliability of the chip's isolation from scribe region contamination.

2 Claims, 6 Drawing Sheets

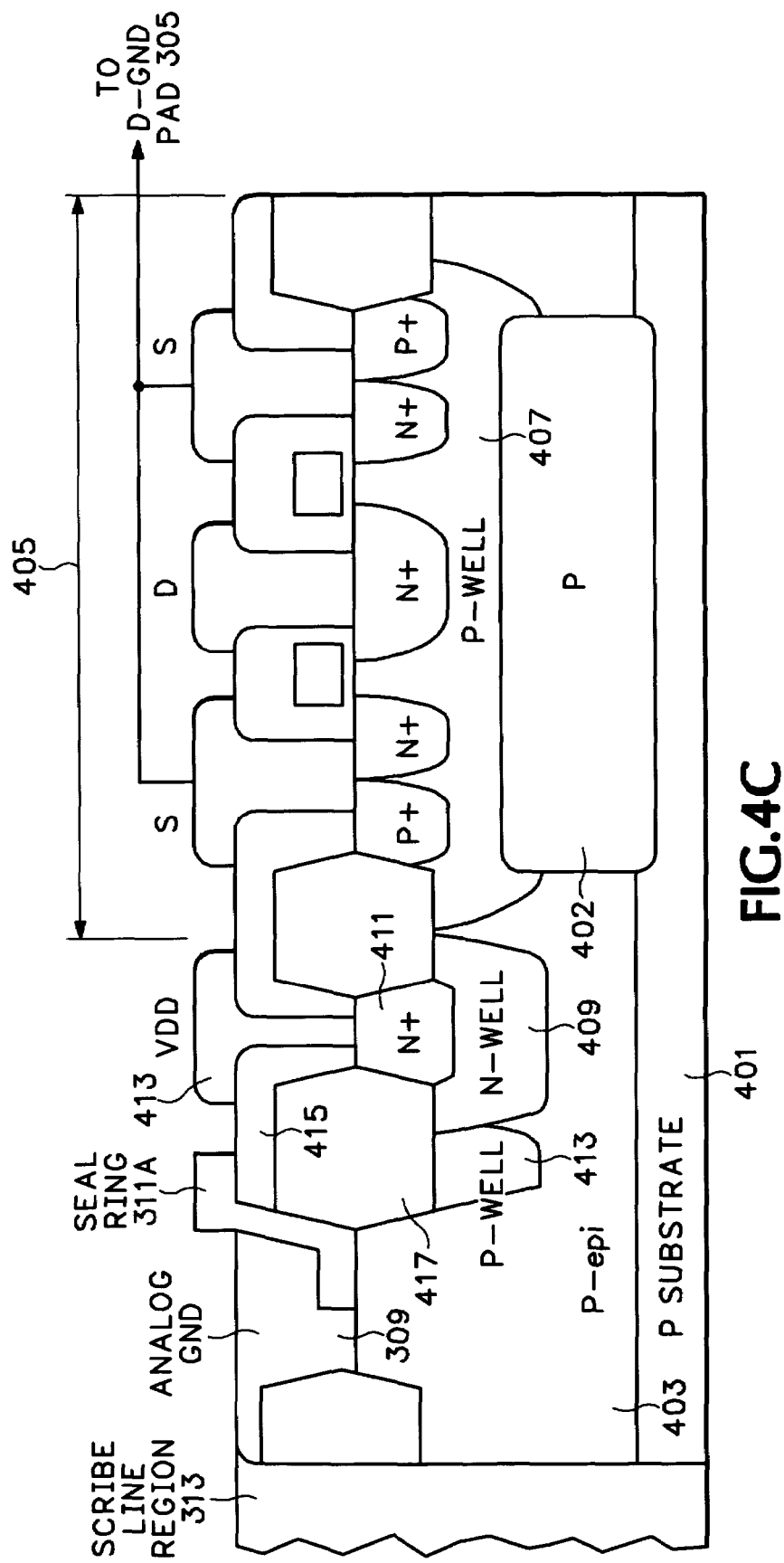

SEAL RING FOR MIXED CIRCUITRY SEMICONDUCTOR DEVICES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

The technology described herein is generally related to the field of semiconductor devices and, more particularly, to seal rings for integrated circuit devices having core circuitry generating both analog and digital signals.

2. Description of Related Art

Integrated circuit (IC) devices, each commonly having an area of less than one square inch, are fabricated simultaneously in multiples on a larger wafer, commonly having a cross-dimension of many inches. The individual IC devices, also known as "chips" or "die," are segregated by "scribe lines" regions where the wafer can be sawed into individual chips once the fabrication is complete. Conventionally, surfaces of the chips are generally protected by the deposition of an uppermost passivation layer. Also conventionally, "seal rings," also known as "guard rings," generally are formed of at least one metal band around at least the upper the periphery of each chip as part of the fabrication of the IC dice prior to sawing the wafer. These seal rings separate each die from surrounding scribe lines, providing structural reinforcement and stopping undesirable moisture and mobile ionic contaminants from the scribe regions (also known as "auto-doping") from entering chip active circuitry regions and affecting operational viability.

Moreover, conventionally it is believed that these seal rings should be electrically tied to the lowest (most negative) chip potential, or grounded. One reason is to prevent corrosion of die interconnects should the seal ring and any area of the core circuitry become in effect a galvanic cell due to the presence of moisture. In other words, if a seal ring were tied to a higher potential, there is the possibility that if there are cracks or pinholes in the chip passivation layer over interconnect metal of a lower potential, then metal at a crack or pinhole would become a galvanic cell anode of very small area compared to the relatively large area of the ring—acting as a galvanic cell cathode—and rapid corrosion at the crack or pinhole could occur.

In modern uses, chips may combine core circuitry—analog circuits, digital circuits, and power circuits—on a single die. In these mixed analog-digital and analog-digital-power IC devices, since the seal ring conventionally completely encircles the chip core circuitry, one problem is that digital circuitry electrical noise can affect operation of analog circuitry. FIG. 1 (Prior Art) is a simplified, schematic, block diagram illustrating such a die 80 (FIG. 1 is also in common assignee's U.S. Pat. No. 6,395,591 (McCormack et al.) as FIG. 4). Generally, each of said die core circuits would have input/output (I/O) connection circuitry, an I/O pad 84 for active signals, and a ground connection (or, alternatively to electrical ground, a connection to the chip's lowest negative electrical potential). Seal rings generally are connected electrically to a wafer substrate which supports the backside of each chip; for example, complementary metal oxide semiconductor (CMOS) devices have a P-type doped substrate connected to the most negative potential for the circuitry, usually a ground potential. This short-circuiting of the seal ring may provide additional electrostatic discharge protection for the chip core circuitry. In FIG. 2 (Prior Art), a schematic, highly-enlarged elevation view of a small-segment 200 of a mixed analog-digital signal IC die is illustrated. The chip is shown as having a known manner metal oxide silicon field effect transistor (MOSFET) 201, part of the digital circuitry, including "Digital GND (S/B)" taps 202 and a "Seal Ring" 203 which also is acting as "Analog GND." The Seal Ring 203 separates the active components of the core circuits from the "Scribe Region" 205. The Seal Ring 203 is shown with a low resistive contact to a "P+ type Substrate" 204 through "P+," "P-Well" and isolation "ISO P" layers. In other words, in accordance with the conventional wisdom, the metal seal ring effectively is shorted to ground through a low resistance path as shown in FIG. 2 (Prior Art)—namely, via the subjacent "P+" implant region to the "P-Well" implant to the "ISO P" buried layer to the "P Substrate." Thus, the connection between the seal ring and substrate may be said to be "ohmic," having a low resistance path to ground, i.e., short-circuited.

It is known that digital circuits and power circuits are in general electrically noisy. On the other hand, analog circuits are generally both quiet and sensitive to electrical noise. In mixed signal integrated circuits such as illustrated by FIG. 1, noisy power and digital core circuit blocks adjacent to the seal ring can couple noise into the quiet analog circuit block via the seal rings ohmic contact to the substrate, disrupting analog operations.

The problem is exacerbated in combined bipolar-CMOS (BiCMOS) chips where a richly doped buried isolation layer exists which forms an excellent conduction path between the substrate and the seal ring(s).

McCormack et al. provide a SELECTIVE SUBSTRATE IMPLANT PROCESS FOR DECOUPLING ANALOG AND DIGITAL GROUNDS, providing a decoupling of power supply noise, such as ground noise, between noisy and noise sensitive circuits within the chip core while also providing immunity against latch-up and electrostatic discharge.

Considering the ever-present design goal of shrinking die size, there is a need for improving the isolation between electrically noisy and noise sensitive semiconductor core circuits.

The present invention addresses such problems.

Many publications describe the details of commonly known techniques used in the fabrication of integrated circuits that can be generally employed in the fabrication of complex, three-dimensional, IC structures; see e.g., *Silicon Processes*, Vol. 1–3, copyright 1995, Lattice Press, Lattice Semiconductor Corporation, Hillsboro, Oreg.; Ghandhi, S. K., *VLSI Fabrication Principles*, copyright 1983, John Wiley & Sons, or *Semiconductor & Integrated Circuit Fabrication Techniques*, Reston Publishing Co., Inc., copyright 1979 by the Fairchild Corporation. Moreover, the individual steps of such a process can be performed using commercially available IC fabrication machines. The use of such machines and common fabrication step techniques may be employed in accordance with practicing the present invention and will be referred to herein as simply, for example, ". . . in a known manner . . . ." As specifically helpful to an understanding of the present invention, approximate technical data are disclosed herein based upon current technology; future developments in this art may call for appropriate adjustments as would be apparent to one skilled in the art. Those techniques can be generally employed in the fabrication of the structure of the present invention. Moreover, the individual steps of such a process can be performed using commercially available integrated circuit fabrication machines. As specifically helpful to an understanding of the present invention, approximate technical data are set forth based upon current technology. Future developments in this art may call for appropriate adjustments as would be obvious to one skilled in the art.

BRIEF SUMMARY

The present invention generally provides for a method and apparatus for selectively isolating peripheral seal rings of semiconductor devices having mixed core circuits. Electrical noise isolation is provided without compromising the reliability of the chip.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

BRIEF DESCRIPTION OF THE DRAWINGS

FIGS. 4A, 4B, and 4C are comparison drawings in which:

FIG. 4A (Prior Art) illustrates a typical mixed circuitry CMOS structure,

FIG. 4B is an elevation view, cross-section, schematic of a small segment 400 of an IC die in accordance with another exemplary embodiment of the present invention, and FIG. 4C illustrates a further refinement to the exemplary embodiment as shown in FIG. 4B.

Like reference designations represent like features throughout the drawings. The drawings in this specification should be understood as not being drawn to scale unless specifically annotated as such.

DETAILED DESCRIPTION

The present invention is described with respect to exemplary embodiments. The exemplary embodiments are provided for enabling implementation and for explaining the best mode(s) of implementation currently known to the inventors. Specific implementations of the present invention may vary from said embodiments. No limitation on the scope of the invention, substantially defined by the Claims hereinafter, is intended by the details of these exemplary embodiments, nor should any be implied therefrom.

In general, in accordance with the present invention, selective seal ring isolation from the substrate and its electrical potential is provided in order to segregate noisy core circuitry from noise sensitive core circuitry in mixed signal semiconductor devices. Appropriate sections of a mixed use circuitry—analog, digital, power—chip are isolated selectively from the substrate through a non-ohmic contact, i.e., with a very high resistance or a junction barrier, to the substrate without compromising reliability of the chip's isolation from scribe region contamination.

Figure 3:
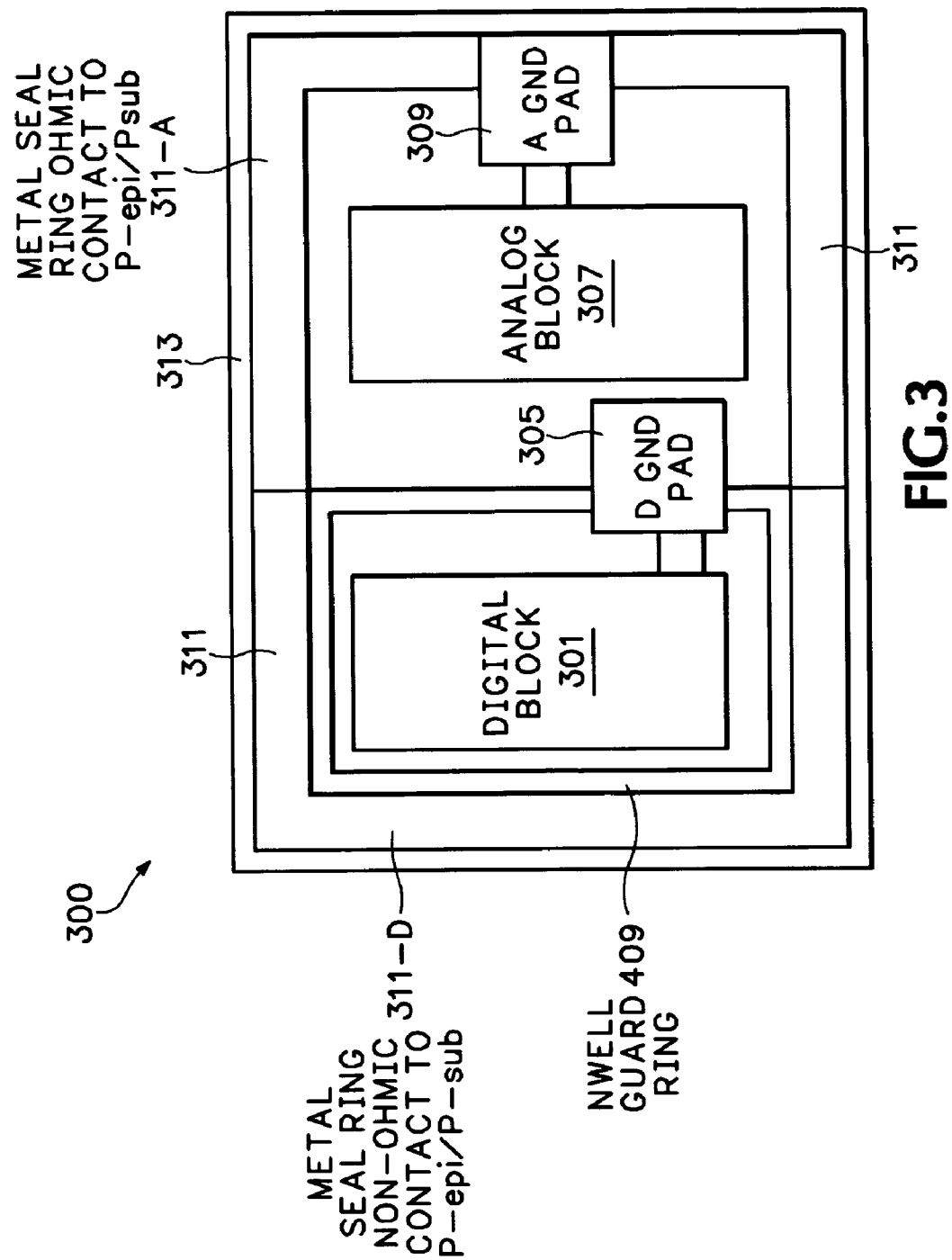
FIG. 3 is an overhead view, schematic illustration of a simplified block diagram of a surface layout for an IC die in accordance with an exemplary embodiment of the present invention.

A CMOS IC example with a P-type, electrically grounded substrate and P-type epitaxial (epi) layer is used with respect to FIGS. 3, 4A, 4B, and 4C. FIG. 3 is a schematic illustration of a simplified block diagram of an exemplary embodiment surface layout for an IC die 300 having both digital and analog core circuitry of a known manner. Digital core circuitry, "Digital Block," 301 has a known manner ground pad, "D-GND PAD," 305. Analog core circuitry, "Analog Block," 307 has a known manner ground pad, "A-GND PAD," 309. A seal ring 311 surrounds the periphery of the core circuitry 301, 307, having two distinct regions 311A, 311D as explained in more detail hereinafter. The die 300 is circumferentially surrounded by scribe line regions 313. Generally, in accordance with an exemplary embodiment of the present invention, the seal ring region 311D which encompasses three sides of the digital core circuitry 301 is fabricated having a relatively very high resistance, or barrier layer junction, non-ohmic, contact to subjacent P-type epitaxial and substrate layers. The non-ohmic contact seal ring region 311D is constructed in regions adjacent to the noisy digital blocks. The seal ring region 311A which encompasses three sides of the analog core circuitry 307 is fabricated having a low resistance, ohmic, contact to the subjacent P-type epitaxial and substrate layers.

Figure 4A:
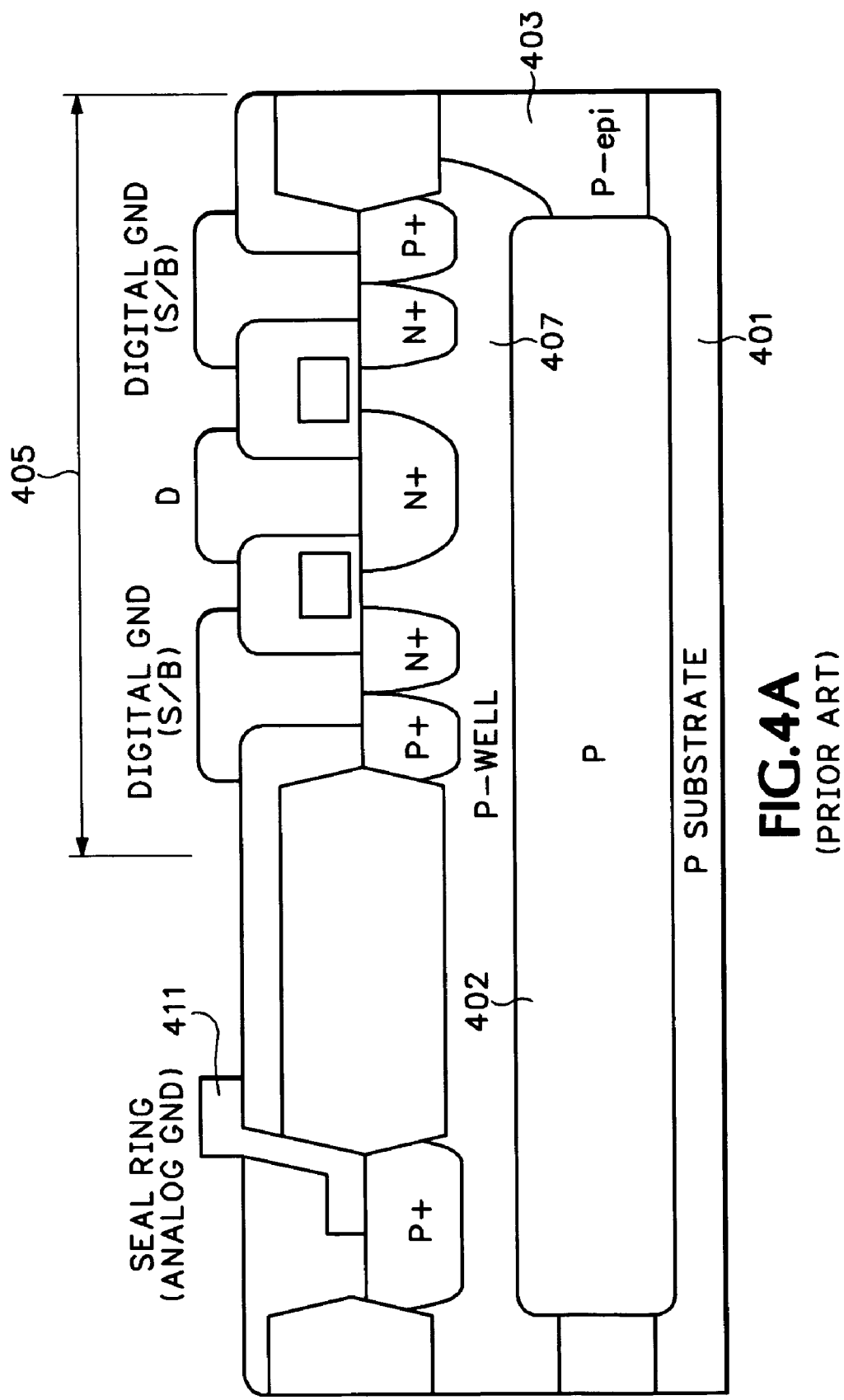

FIG. 4A (Prior Art) illustrates a typical CMOS structure fabricated on a doped P substrate 401, having a superjacent P epitaxial layer 403, a P doped buried isolation layer 402, and a P well 407 as is known in the art for constructing active devices therein. As one example of known manner core circuitry, a typical, relatively large and electrically noisy, N-type, power MOSFET 405 (see also, FIG. 1, "Power Transistors") is illustrated, wherein the source, "S," regions may be tied to the digital ground pad (see e.g., FIG. 3, 305). Again, it should be recognized that this MOSFET is merely representative of core circuitry in general and not a limitation on the scope of the invention. The NMOSFET 405 will switch relatively high currents which causes noise generated by switching transients which may couple into the P substrate 401 and therethrough into the analog seal ring 411 coupled to analog ground (see e.g., FIG. 3, 309).

Figure 4B:
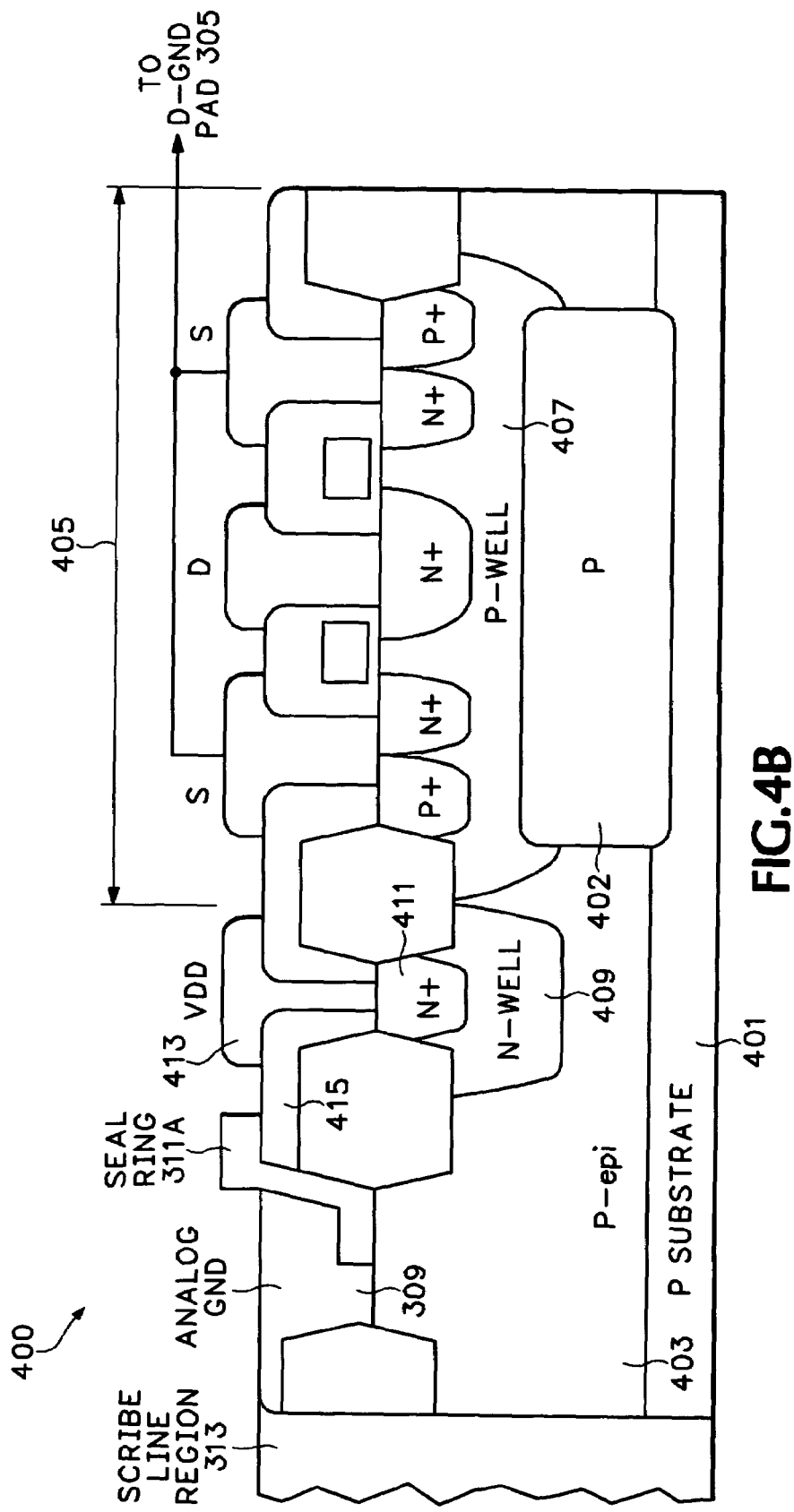

In comparison to FIG. 4A and with reference now to another embodiment of the present invention as shown in FIG. 4B, a basic aspect of the present invention is that doped P-well and buried layer regions are formed during chip fabrication so as not to extend subjacently to the analog core circuitry seal ring region. More particularly, FIG. 4B is a schematic of a small segment 400 of an IC die. For simplicity, overlying top layers, e.g., multiple metallization layers, passivation, and the like, are omitted as unnecessary to an understanding of the present invention. The IC 400 has a P Substrate 401 with a superjacent P epi layer 403, a buried isolation layer 402, and a P well 407 in which active circuit devices are formed. Exemplary NMOSFET 405 will have a non-ohmic contact with the P substrate 401 as detailed hereinabove. Accordingly, the regions 311D (FIG. 3) of the seal ring around the NMOSFET 405 will have a non-ohmic contact to the P substrate 401. The seal ring region 311A for the chip region having the analog core circuitry 307 is connected to the analog ground pad 309 (see also FIG. 3). As demonstrated by FIG. 4B, both the P well 407 and the P buried isolation layer 402 are stopped so as not to extend under the analog circuitry seal ring region 311A where the seal ring region 311A makes contact with the subjacent silicon layers, viz., the P epi 403 and respectively subjacent P substrate 401. Resultantly, the analog core circuitry seal ring region 311A now has a low resistance, ohmic, contact to the P epi 403 and subjacent, P+ substrate 401. This increases the isolation between the analog core circuitry from the noise of the digital core circuitry via the P substrate.

Figure 1:
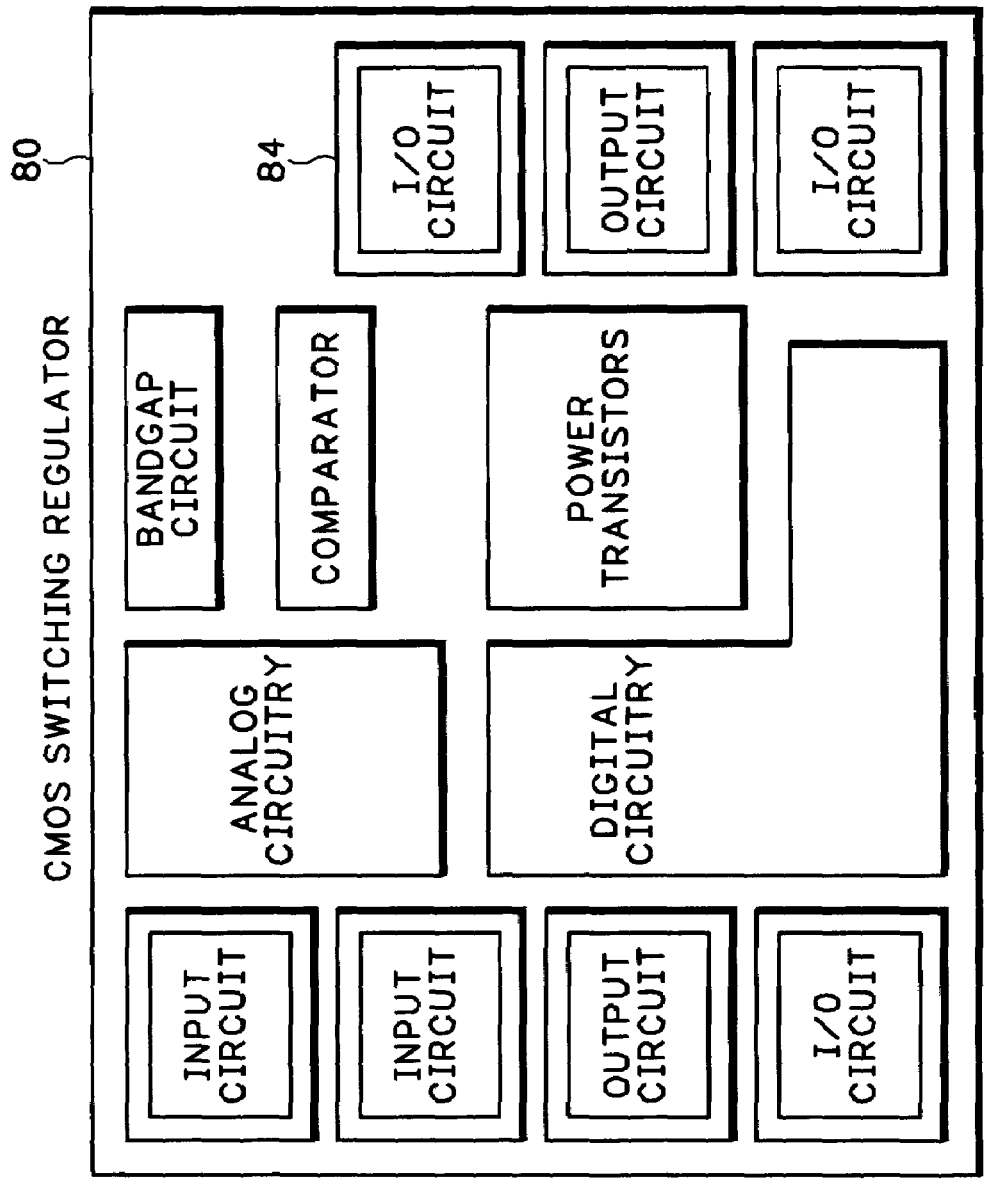
FIG. 1 (Prior Art) is a overhead view of a simplified, schematic, block diagram illustrating a mixed, analog and digital, signal type IC die.

In a preferred implementation for the exemplary embodiment demonstrated by FIG. 4B, the structure may be refined by adding an N well type guard ring 409, connected by an N+ region 411 to power supply voltage VDD trace 413, inserted between the analog core circuitry seal ring region 311A and the body of NMOSFET transistor(s) 405 (see also FIG. 1, "Power transistors"). As may be best seen in FIG. 3, the N well guard ring 409 encompasses the Digital Block 301 of the digital core circuitry. This further increases the electrical isolation between the seal ring region 311A and the body of the NMOSFET and its electrically connected power grid.

FIG. 4C illustrates a further refinement to the exemplary embodiment in FIG. 4B. In order to stop the N-well guard ring 409 depletion region from extending under the analog seal ring region 311A, a P well guard ring 413 may be formed in the P epitaxial layer 403 around the periphery of the N well guard ring. Note that the P well guard ring 413 preferably is formed only under oxide layers 415, 417 separating the analog circuitry seal ring region 311A from the P epitaxial layer 403 to maintain the isolation. Alternatively to the P well guard ring 413, a known manner surface boron P-type field threshold (BFLD) implant may be employed.

It should now be recognized that the basic aspects of the present invention of isolating seal ring regions adjacent to analog core circuitry on a chip from seal ring regions adjacent to digital and power-related core circuitry on a chip provides a decrease in noise coupled into generally electrically quiet analog core circuitry from generally electrically noisy digital and power-related circuitry without compromising either scribe region contaminant isolation of the active core circuitry and reliability of the chip. There are at least two implementations of contact between the seal ring and the substrate—namely, lowest chip potential or ground—which will accomplish this goal:

TABLE

| Implementation | Digital Core Seal Ring | Analog Core Seal Ring | Power Core Seal Ring |
|---|---|---|---|
| 1 | Ohmic Contact | Ohmic Contact | Non-Ohmic Contact |
| 2 | Non-Ohmic Contact | Ohmic Contact | Ohmic Contact |
| 3 | Ohmic Contact | Non-ohmic Contact | (Not On-board) |
| 4 | Non-ohmic Contact | Ohmic Contact | (Not On-board) |

While the present invention has been shown in the exemplary embodiments of FIGS. 3 and 4A, 4B, and 4C for a CMOS implementation, it should be recognized that it is intended to also be applicable to bipolar-complementary metal oxide semiconductor (BiCMOS) chip implementations.

Figure 2:
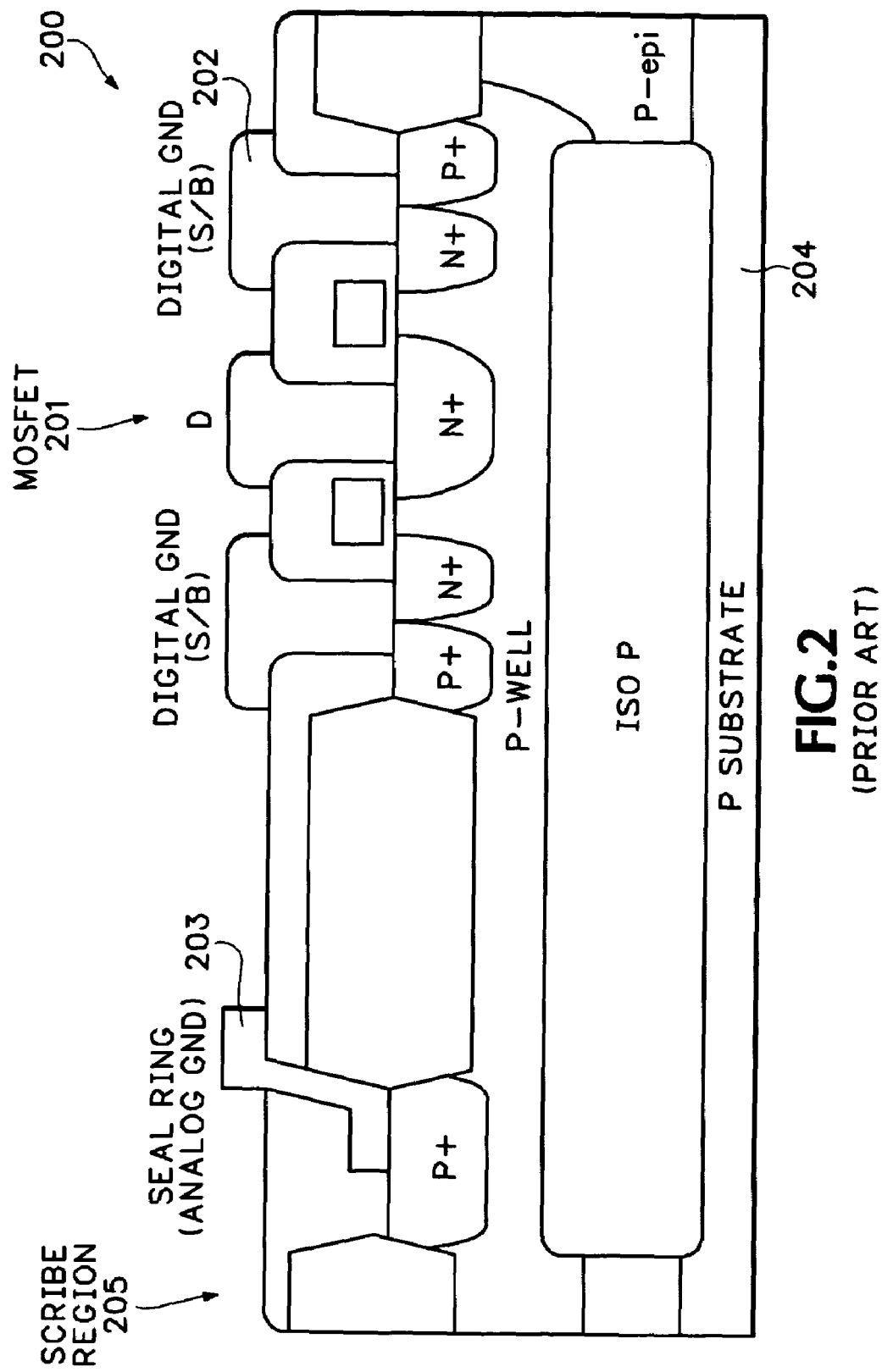
FIG. 2 (Prior Art) is an elevation view illustration of a die with a metal seal ring shorted to ground through a low resistance path.

In CMOS implementations, to make an ohmic contact between seal ring regions and the most negative electrical potential biased substrate, a P-type buried layer (see e.g. FIG. 4A–C, 402, P-type well (see e.g. FIG. 4A–C, 407) and P+ implant region beneath the seal ring (see e.g., FIG. 2 and 4A only) structure is used. For BiCMOS implementations, it has been found sufficient to have the buried layer beneath the seal ring. In CMOS implementations, to make a non-ohmic contact between seal ring regions and the most negative electrical potential biased substrate, there is an omission of P-type well and P-type buried layer subjacent the seal ring regions; and, optionally, a N-type guard ring about the digital core circuitry (see e.g., FIG. 3, 409) may be employed, with or without a P-type depletion guard ring (FIG. 4C, 413). In BiCMOS implementations, a P-type well and P-type buried layer is located beneath the seal ring regions where ohmic contact is desired.

In summary, the present invention as demonstrated by the detailed exemplary embodiments described hereinabove provides improved electrical noise isolation in mixed signal, analog-digital-power, integrated circuit devices via selective electrical isolation of predetermined regions of a seal ring construct.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A semiconductor device having both electrically noisy circuitry, having a first electrical potential common connection, and electrically quiet circuitry, having a second electrical potential common connection, the device comprising:
   a conductive material ring substantially encompassing said noisy circuitry and said quiet circuitry; and an ohmic electrical connection to a first region of said ring and a non-ohmic electrical connection to a second region of said ring, such that there is electrical isolation between said first electrical potential common connection and said second electrical potential common connection.

2. The device as set forth in claim 1 in an integrated circuit having a substrate having a most negative electrical potential for said integrated circuit, and wherein said electrically noisy circuitry includes primarily integrated circuit digital signal circuitry, integrated circuit power circuitry, or both, and said electrically quiet circuitry includes primarily integrated circuit analog circuitry, having either an ohmic contact between said electrically noisy circuitry and said substrate and a non-ohmic contact between said electrically quiet circuitry and said substrate, or a non-ohmic contact between said electrically noisy circuitry and said substrate and an ohmic contact between said electrically quiet circuitry and said substrate.

* * * * *